United States Patent
Pande et al.

(10) Patent No.: US 7,137,054 B2
(45) Date of Patent: Nov. 14, 2006

(54) SYSTEM AND APPARATUS FOR SCANNING INTEGRATED CIRCUITS WITH NUMERICALLY CONTROLLED DELAY LINES

(75) Inventors: Anand Pande, Bangalore (IN); Syed Mohammed Ali, Bangalore (IN); Naresh Chandra Srinivas Koppineedi, Bangalore (IN); Ravindra Bindus, Bangalore (IN); Ramanujan K. Valmiki, Bangalore (IN)

(73) Assignee: Broadcom Corporation, Irvine, CA (US)

(*) Notice: Subject to any disclaimer, the term of this patent is extended or adjusted under 35 U.S.C. 154(b) by 531 days.

(21) Appl. No.: 10/420,165

(22) Filed: Apr. 22, 2003

(65) Prior Publication Data

US 2004/0098647 A1    May 20, 2004

Related U.S. Application Data

(60) Provisional application No. 60/426,579, filed on Nov. 15, 2002.

(51) Int. Cl.
*G01R 31/28* (2006.01)

(52) U.S. Cl. .................................................. 714/726
(58) Field of Classification Search ................ 714/726, 714/727, 729, 731
See application file for complete search history.

(56) References Cited

U.S. PATENT DOCUMENTS 6,286,118 B1 * 9/2001 Churchill et al. ........... 714/726
6,286,119 B1 * 9/2001 Wu et al. .................... 714/726

* cited by examiner

*Primary Examiner*—Albert Decady
*Assistant Examiner*—James C. Kerveros
(74) *Attorney, Agent, or Firm*—McAndrews, Held & Malloy, Ltd.

(57) ABSTRACT

A system and method for scan testing an NCDL and latches controlled by the NCDL is presented. The NCDL is controlled by control logic, a switch is used to control the latches by a clock signal that is not controlled by the control logic. A controllability circuit provides test vectors to, and controls, the NCDL. The outputs of the NCDL are observed by an observability circuit that captures the outputs of the NCDL.

31 Claims, 3 Drawing Sheets

US 7,137,054 B2

SYSTEM AND APPARATUS FOR SCANNING INTEGRATED CIRCUITS WITH NUMERICALLY CONTROLLED DELAY LINES

RELATED APPLICATIONS

This application claims priority to Provisional Application for U.S. Patent, Ser. No. 60/426,579, entitled "Scan Structures for Numerically Controlled Delay Lines", by Pande, et. al., filed Nov. 15, 2002, which is incorporated herein by reference in its entirety for all purposes.

FEDERALLY SPONSORED RESEARCH OR DEVELOPMENT

[Not Applicable]

[MICROFICHE/COPYRIGHT REFERENCE]

[Not Applicable]

BACKGROUND OF THE INVENTION

Numerically controlled delay lines (NCDLs) are used wherever a signal needs to be delayed by a quantum that is directly proportional to a "delay control number". In most cases the delayed signal is a clock that is used to drive certain flip-flops of a system. For example, DDR-DRAM-controllers widely deploy NCDLs to provide a 90 degree shift to read data register clock signals, so that data capture occurs at the center of the data valid window.

Scan design is one of the most effective and widely used designs for testability techniques. Based on its capability to provide high fault coverage for complex integrated circuits, scanning is effectively used to screen out parts with manufacturing defects. The highest manufacturing test quality or best fault coverage is achieved when all nodes in a device under test are controllable and observable. A node is controllable if the node can be driven to a specified logic value by setting primary inputs to specific values. A sequential cell is scan controllable when the cell can be set to a known state by serially shifting in specific logic values. A node is observable if a fault at the node can be propagated to primary outputs where response can be measured. A sequential cell is scan observable when the cell state can be observed by serially shifting out data.

However, the output clock signal from an NCDL can be uncontrollable in scan test mode in certain cases. For example, where an NCDL is used to control flip flops, the clock reaching the flip-flops can be uncontrollable in scan test mode. Even when the logic controlling the NCDL is stitched in a scan chain, the value attained in the capture phase may cause a change in the delay control number. The possible change in the delay control number causes the clock signal to have an unpredictable time of arrival. The variable time of arrival of the clock signal poses difficulties in capturing the test pattern response of the flip-flops.

Additionally, the clock output of the NCDL is not observable at a scan flip-flop (pseudo-primary output). This causes the delay chain combinatorial structure to remain uncovered by the scan. In applications where fine granularity as well as high total delay is required, the delay chains can have huge combinatorial structures. The inability to cover the combinatorial structure of the delay chain may result in a substantial portion of the chip/core being uncovered and untested.

Further limitations and disadvantages of conventional and traditional approaches will become apparent, through comparison of such systems with the present invention as set forth in the remainder of the present application with reference to the drawings.

BRIEF SUMMARY OF THE INVENTION

A system and apparatus for scan testing circuits comprising NCDLs and latches controlled by NCDLs are presented herein. In one configuration, a switch controls registers receiving inputs from an NCDL. The switch receives a clock signal and the output from the NCDL. During scan testing, the switch selects the clock signal, while during regular operation, the switch selects the output of the NCDL.

In another configuration, a switch controls the input to the NCDL. During scan testing, the switch selects the output of a controllability scan flop for input to the NCDL. During the shift phase of the scan test, the controllability scan flop provides a test vector for input to the NCDL. Additionally, an observability scan flop receives and captures the output of the NCDL during the capture phase of the scan test.

In another configuration, a control/observe scan flop provides the test vector to the NCDL during the shift phase of scan testing and captures the output of the NCDL during the capture phase of scan testing.

These and other advantages and novel features of the embodiments in the present application will be more fully understood from the following description and in connection with the drawings.

DETAILED DESCRIPTION OF THE INVENTION

Figure 1:
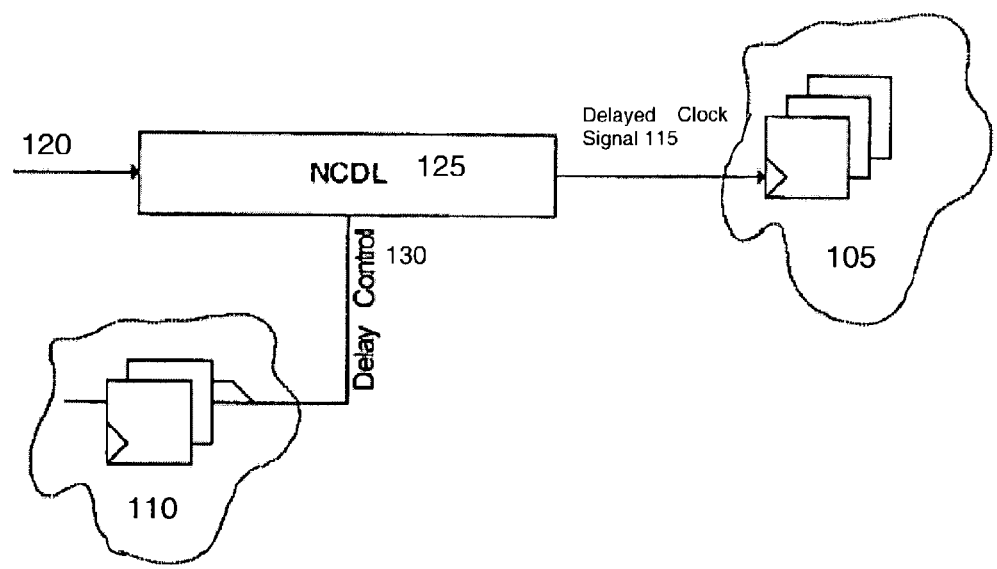
FIG. 1 is a block diagram describing an exemplary circuit wherein aspects of the present invention can be practiced.

Referring now to FIG. 1, there is illustrated a block diagram of an exemplary circuit wherein aspects of the present invention can be practiced. The circuit includes registers receiving a delayed clock 105, and delay control logic 110. The registers receiving a delayed clock 105 can comprise combinatorial logic gates and/or flip-flops. The registers receiving a delayed clock 105 are controlled by a delayed signal 115. The delayed signal 115 is delayed from signal 120 by a controllable period of time. The signal 120 can comprise, for example, a clock signal.

The delay of the delayed signal 115 is caused by a numerically controlled delay line (NCDL) 125. The NCDL 125 includes logic that can delay the propagation of signal 120 to the registers receiving a delayed clock 105. The period of time of the delay is controllable by the delay control logic 110. The delay control logic 110 can comprise combinatorial logic gates and/or flip-flops. The delay control logic 110 controls the NCDL 125 by transmitting a delay control signal 130. The delay control signal 130 controls the period of time that the delayed signal 115 is delayed from signal 120.

Scan testing is one of the most effective and widely used designs for testability techniques. The highest manufacturing test quality or best fault coverage is achieved when all the nodes in a design are controllable and observable. In cases where an NCDL provides a delayed clock signal to a group of latches 105, such as NCDL 125 providing delayed signal 115 to the registers receiving a delayed clock 105, it is desirable to control and observe both the NCDL and the group of latches that receive the delayed signal.

In order to reliably capture data from a group of latches receiving a delayed clock signal, a delay chain bypass mechanism is inserted. The delay chain bypass mechanism disables the effect of the delay control logic on the registers receiving a delayed clock.

Figure 2:
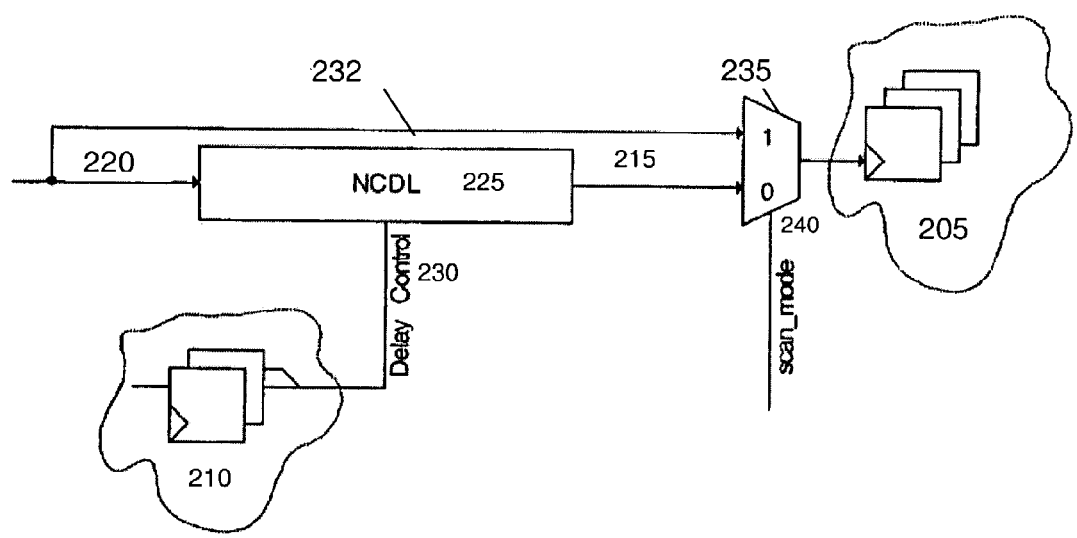
FIG. 2 is a block diagram describing an exemplary scan configuration for scanning logic controlled by an NCDL in accordance with an embodiment of the present invention.

Referring now to FIG. 2, there is illustrated a block diagram describing a scan testing configuration wherein a group of latches controlled by an NCDL is scanned. The scan testing configuration comprises registers receiving a delayed clock 205, and delay control logic 210. The registers receiving a delayed clock 205 are controlled by a delayed signal 215. The delayed signal 215 is delayed from signal 220 by an NCDL 225. Signal 220 can comprise, for example, a clock signal. The period of time of the delay caused by the NCDL 225 is controlled by the delay control logic 210. The delay control logic 210 transmits to the NCDL 225, a delay control signal 230 that controls the delay period.

In order to disable the delay control logic 210 control on the delayed signal for the registers receiving a delayed clock 205 during scan testing, the NCDL 225 is bypassed during scan testing. A bypass loop 232 is connected to the signal 220 and is parallel to the NCDL 225. The delayed signal 215 output from the NCDL 225 and the bypass loop 232 (which carries signal 220) are connected to a switch 235. The switch 235 can comprise, for example, a multiplexer. The switch 235 selectively bypasses the NCDL 225 and the delay signal 215 during scan testing by selecting the bypass loop 232.

The switch 235 is controlled by a scan mode signal 240. During the scan mode, the scan mode signal 240 is asserted causing the switch 235 to select the bypass loop 232. Selection of the bypass loop 232 allows signal 220 to be transmitted directly to, and control the registers receiving a delayed clock 205. Accordingly, the delay control logic 210 control of the registers receiving a delayed clock 205 is disabled. The foregoing configuration ensures that a test signal (a clock in this case) reaches the first group of registers 205, irrespective of the value of the second group of registers 210. During regular operation, the scan mode signal 240 is deasserted, causing the switch 235 to select the delayed signal 215 from the NCDL 225.

The foregoing configuration allows controllability of latches controlled by an NCDL 225. However, as noted above, it is also desirable to scan the NCDL 225. Scanning the NCDL 225 is achieved by making the input to the NCDL 225 controllable and the output of the NCDL observable.

Figure 3:
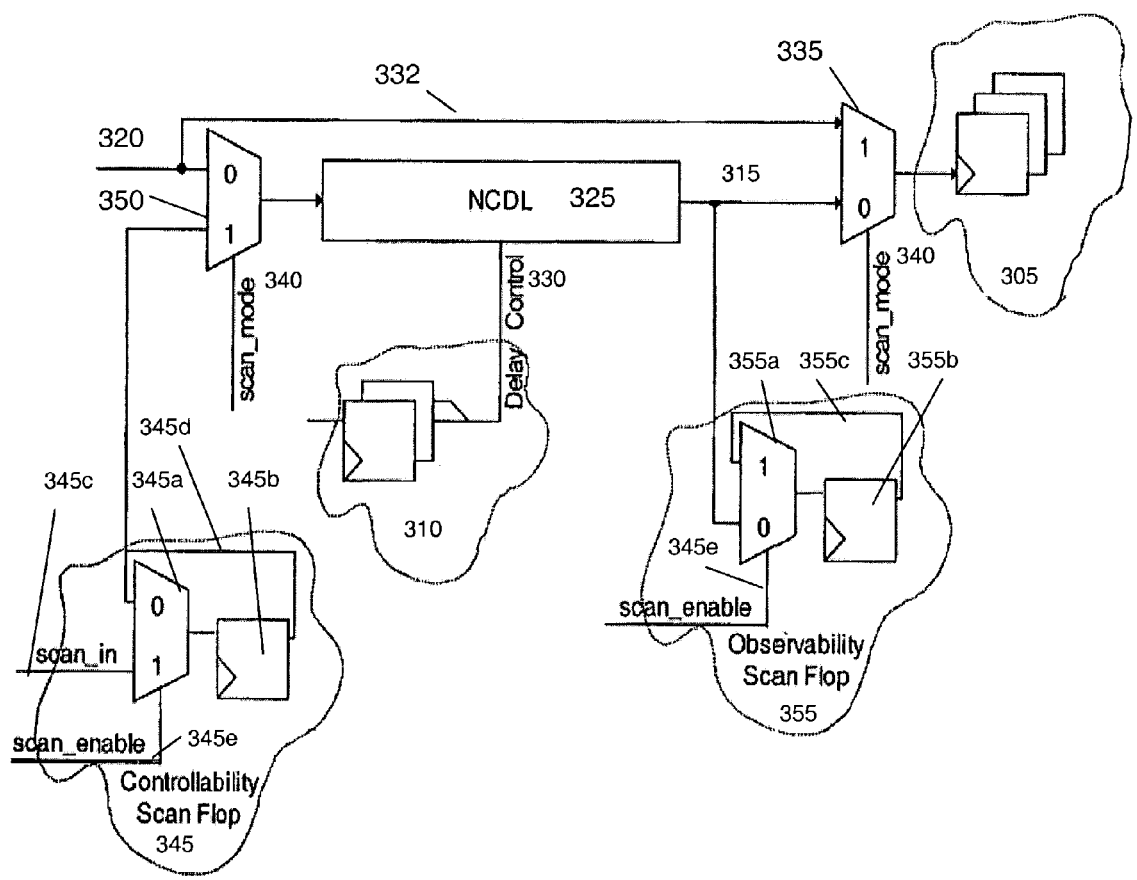
FIG. 3 is a block diagram describing an exemplary scan configuration for scanning an NCDL in accordance with an embodiment of the present invention.

Referring now to FIG. 3, there is illustrated a block diagram of a configuration for scanning an NCDL 325 in accordance with an embodiment of the present invention. The scan testing configuration comprises registers receiving a delayed clock 305, and a delay control logic 310. The registers receiving a delayed clock 305 are controlled by a delayed signal 315. The delayed signal 315 is delayed from another signal 320 by an NCDL 325. Signal 320 can comprise, for example, a clock signal. The period of time of the delay by the NCDL 325 is controlled by the delay control logic 310. The delay control logic 310 transmits to the NCDL 325, a delay control signal 330 that controls the delay period. A bypass loop 332 is in parallel to the NCDL 325. The delayed signal output 315 from the NCDL and the bypass loop 332 (which carries the clock signal 320) are connected to a MUX 335. During scan testing, the switch 335 provides the signal 320 to the delay control logic 305.

In one embodiment, in order to make the NCDL 325 controllable, a controllability scan flop 345 is used to control the input to the NCDL 325 during scan testing. The controllability scan flop 345 provides test vectors to the NCDL 325 and preferably forms a portion of scan chain that is controllable from an accessible input. For example, the scan chain can be connected to a primary input pin in an integrated circuit. The controllability scan flop 345 and the signal 320 are connected to a switch 350. The output of the switch 350 is provided to the NCDL 325. The switch 350 is controlled by the scan mode signal 340. During scan testing, the scan mode signal 340 is asserted, causing the switch 350 to select the controllability scan flop 345 as the input to the NCDL 325. During regular operation, the scan mode signal is deasserted, causing the switch 350 to select signal 320.

In an exemplary case, the controllability scan flop 345 can comprise a switch 345a and a flip-flop 345b. The controllability scan flop 345 provides the contents of the flip-flop 345b to the switch 350. The switch 345a controls the contents of the flip-flop 345b. The switch 345a receives a scan vector line 345c and a feedback loop 345d from the flip-flop 345b and is controlled by a scan enable signal 345e.

Scan testing usually comprises two phases, namely, the shift phase and the capture phase. During the shift phase, a test vector is shifted into the scanned circuit, while during the capture phase, the outputs of the scanned circuit are captured. The scan enable signal 345e distinguishes between the two phases during scan testing. The scan enable signal 345e is asserted in the shift phase and deasserted in the capture phase.

Assertion of the scan enable 345e signal causes the switch 345a to select the scan vector line 345c. The scan vector line 345c provides a test vector for the NCDL 325. During the capture phase of scan testing, the scan enable signal 345e is deasserted causing the switch 345a to select the feedback loop 345d.

In order to make the NCDL 325 observable during scan testing, an observability scan flop 355 is connected to the output of the delayed clock signal 315 of the NCDL 325. The observability scan flop 355 captures the output of the NCDL 325 during scan testing. The observability scan flop 355 preferably forms a portion of a scan chain that is observable at an accessible output. For example, the scan chain can be connected to a primary output pin in an integrated circuit.

In an exemplary case, the observability scan flop 355 comprises a switch 355a, and a flip-flop 355b. The switch 355a controls the contents of the flip-flop 355b and is connected to the output (the delayed clock signal 315) of the NCDL 325 and a feedback loop 355c from the flip-flop 355b. The switch 355a is controlled by a scan enable signal 345e. During the capture phase of scan testing, the scan enable signal 345e is deasserted, causing the switch 355a to select the delayed signal 315, and the flip flop 355b to capture the delayed signal 315. After the data is captured, the scan enable signal 345e is asserted again, causing the response recorded at the flip-flop 355b to be shifted out.

Figure 4:
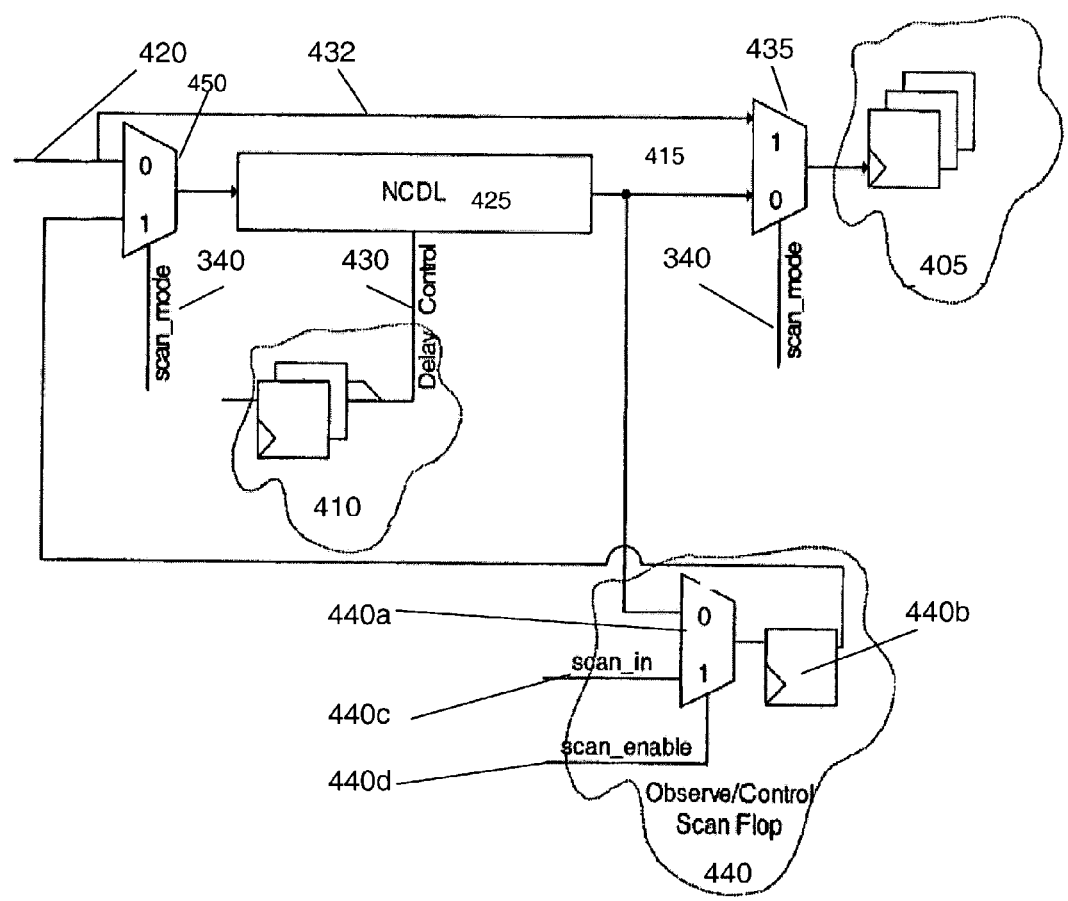
FIG. 4 is a flow diagram for scanning an NCDL and logic controlled by the NCDL in accordance with an embodiment of the present invention.

Referring now to FIG. 4, there is illustrated a block diagram describing a configuration for scan testing an NCDL and group of controlled latches in accordance with an alternate embodiment of the present invention. The scan testing configuration comprises registers receiving a delayed clock 405, and delay control logic 410. The registers receiving a delayed clock 405 are controlled by a delayed signal 415. The delayed signal 415 is delayed from another clock signal 420 by an NCDL 425. Signal 420 can comprise, for example, a clock signal. The period of time of the delay by the NCDL 425 is controlled by the delay control logic 410. The delay control logic 410 transmits to the NCDL 425, a delay control signal 430 that controls the delay period. A bypass loop 432 is in parallel to the NCDL 425. The delayed signal 415 output from the NCDL and the bypass loop 432 (which carries the clock signal 420) are connected to a multiplexer or switch 435.

In one embodiment, in order to make the NCDL 425 controllable and observable, an observe/control scan flop 440 is connected to a switch 450 controlling the input to the NCDL 425. The switch 450 receives signal 420 and an output from the observe/control scan flop 440. During scan testing, the switch 450 selects the output of the observe/control scan flop 440 as the input to the NCDL 425. The observe/control scan flop 440 is also connected to the output of the NCDL, the delayed signal 415. During scan testing, observe/control scan flop 440 captures the delayed signal 415.

In an exemplary case, the observe/control scan flop 440 can comprise a switch 440*a* and a flip-flop 440*b*. The switch 440*a* controls the inputs to the flip-flop 440*b*. The switch 440*a* receives a test vector line 440*c* and the delayed clock signal 415 and is controlled by a scan enable signal 440*d*. The scan enable signal 440*d* is asserted during the shift phase, causing the flip-flop 440*b* to receive a test vector for shifting into the NCDL 425. The scan enable signal 440*d* is deasserted during the capture phase, causing the flip-flop 440*b* to receive the delayed clock signal 415 for capture.

While the invention has been described with reference to certain embodiments, it will be understood by those skilled in the art that various changes may be made and equivalents may be substituted without departing from the scope of the invention. In addition, many modifications may be made to adapt particular situation or material to the teachings of the invention without departing from its scope. Therefore, it is intended that the invention not be limited to the particular embodiment(s) disclosed, but that the invention will include all embodiments falling within the scope of the appended claims.

The invention claimed is:

1. A circuit for scan testing, said circuit comprising:
a signal line for providing a signal;
an NCDL for providing a delayed signal; and
a switch for providing the signal to a group of latches during scan testing, and otherwise providing the delayed signal to the group of latches;
wherein the NCDL receives the signal line providing the signal and wherein the delayed signal is offset from the signal a certain period of time.

2. The circuit of claim 1, further comprising:
delay control logic for controlling the certain period of time.

3. The circuit of claim 1, further comprising:
a bypass loop for providing the signal to the switch, said bypass loop bypassing the NCDL.

4. The circuit of claim 1, further comprising:
a scan mode signal for controlling the switch.

5. A circuit for scan testing, the circuit comprising:
a signal line for providing a signal;
a controllability circuit for providing a test vector;
a first switch for providing the test vector to an NCDL during scan testing and for otherwise providing the signal to the NCDL; and
an observability circuit for capturing an output from the NCDL.

6. The circuit of claim 5, further comprising:
a scan mode signal for controlling the first switch.

7. The circuit of claim 5, wherein the controllability circuit further comprises:
a test vector line for providing the test vector;
a second switch for selecting the test vector during a shift phase of scan testing; and
a flip-flop for providing the registered output of the second switch to the first switch.

8. The circuit of claim 7, wherein the controllability circuit further comprises:
a scan enable signal for controlling the second switch.

9. The circuit of claim 5, wherein the observability circuit further comprises:
a third switch for selecting the output of the NCDL a capture phase of the scan test; and
a flip-flop for storing the selection of the third switch.

10. The circuit of claim 9, wherein the third switch is controlled by the scan enable line.

11. The circuit of claim 5, further comprising:
a fourth switch for providing the signal to a group of delayed latches during scan testing, and otherwise providing the output of the NCDL to a group of latches.

12. A device for scan testing, said device comprising:
a signal line for providing a signal;
a circuit for providing a test vector;
a first switch for providing the test vector to an NCDL during scan testing and for otherwise providing the signal to the NCDL; and
wherein the circuit captures an output from the NCDL.

13. The circuit of claim 12, further comprising:
a scan mode signal for controlling the first switch.

14. The circuit of claim 12, wherein the circuit further comprises:
a test vector line for providing the test vector;
a second switch for selecting the test vector during a shift phase of scan testing and for selecting the output of the NCDL during a capture phase of scan testing; and
a flip-flop for providing the test vector to the first switch.

15. The circuit of claim 14, wherein the controllability circuit further comprises:
a scan enable signal for controlling the second switch.

16. The circuit of claim 12, further comprising:
a third switch for providing the signal to a group of delayed latches during scan testing, and otherwise providing the output of the NCDL to a group of latches.

17. A circuit for scan testing, said circuit comprising:
a signal line providing a signal;
an NCDL connected to the signal line; and
a switch connected to the NCDL and the signal line, wherein the switch connects the signal line to a group of latches during scan testing, and otherwise connects the NCDL to the group of latches; and
wherein the signal line is connected to the NCDL and wherein the NCDL provides a delayed signal that is offset from the signal by a certain period of time.

18. The circuit of claim 17, further comprising:
control logic connected to the NCDL.

19. The circuit of claim 17, further comprising:
a bypass loop connecting the signal line to the switch, said bypass loop bypassing the NCDL.

20. The circuit of claim 17, further comprising:
a scan mode signal connected to the switch.

21. A circuit for scan testing, the circuit comprising:
a signal line;
a controllability circuit;
a first switch connected to the signal line and the controllability circuit, wherein the first switch connects the controllability circuit to the NCDL during scan testing and otherwise connects the signal line to the NCDL; and
an observability circuit connected to an output from the NCDL.

22. The circuit of claim 21, further comprising:
a scan mode signal connected to the first switch.

23. The circuit of claim 21, wherein the controllability circuit further comprises:
a test vector line;
a flip-flop connected to the first switch; and
a second switch connected to the test vector line, wherein the second switch connects the test vector line to the flip-flop during a shift phase of scan testing.

24. The circuit of claim 23, wherein the controllability circuit further comprises:
a scan enable signal connected to the second switch.

25. The circuit of claim 21, wherein the observability circuit further comprises:
a flip-flop; and
a third switch connected to the output of the NCDL, and wherein the third switch connects the output of the NCDL to the flip-flop during a capture phase of the scan test.

26. The circuit of claim 25, wherein the observability circuit further comprises a scan enable line connected to the third switch.

27. The circuit of claim 21, further comprising:
a fourth switch connected to the signal and the output of the NCDL, wherein the fourth switch connects the signal to a group of delayed latches during scan testing, and otherwise connects the output of the NCDL to the group of delayed latches.

28. A circuit for scan testing, said circuit comprising:
a signal line;
a circuit providing a test vector;
a first switch connected to the circuit and the signal line, wherein the first switch connects the circuit to an NCDL during scan testing and otherwise connects the signal line to the NCDL; and
wherein the circuit is connected to the output of the NCDL.

29. The circuit of claim 28, further comprising:
a scan mode signal connected to the first switch.

30. The circuit of claim 28, wherein the circuit further comprises:
a test vector line providing the test vector;
a flip flop connected to the first switch;
a second switch connected to the test vector line and the output of the NCDL, wherein the second switch connects the test vector line to the flip-flop during a shift phase of scan testing and connects the output of the NCDL to the flip-flop during a capture phase of scan testing.

31. The circuit of claim 30, wherein the controllability circuit further comprises:
a scan enable signal connected to the second switch.

* * * * *